US012642032B2

(12) United States Patent
Moon et al.

(10) Patent No.: US 12,642,032 B2
(45) Date of Patent: May 26, 2026

(54) METHOD FOR TREATING SUBSTRATE USING BORON COMPOUND

(71) Applicant: TES CO., LTD, Yongin-si (KR)

(72) Inventors: Hyeong-Wook Moon, Yongin-si (KR);
Bong-Soo Kwon, Yongin-si (KR);
Se-Woong Bae, Yongin-si (KR);
Eun-Jin Song, Yongin-si (KR)

(73) Assignee: TES CO., LTD, Yongin-si (KR)

( * ) Notice: Subject to any disclaimer, the term of this patent is extended or adjusted under 35 U.S.C. 154(b) by 33 days.

(21) Appl. No.: 18/843,106

(22) PCT Filed: Feb. 22, 2023

(86) PCT No.: PCT/KR2023/002561
§ 371 (c)(1),
(2) Date: Aug. 30, 2024

(87) PCT Pub. No.: WO2023/167464
PCT Pub. Date: Sep. 7, 2023

(65) Prior Publication Data
US 2025/0174454 A1     May 29, 2025

(30) Foreign Application Priority Data
Mar. 4, 2022     (KR) ........................ 10-2022-0028405

(51) Int. Cl.
H10P 70/00          (2026.01)
H01J 37/32          (2006.01)
H10P 50/28          (2026.01)
(52) U.S. Cl.
CPC ........ H10P 70/23 (2026.01); H01J 37/32357 (2013.01); H01J 37/32871 (2013.01);
(Continued)

(58) Field of Classification Search
CPC ............ H01L 21/0206; H01L 21/31122; H01J 37/32357; H01J 37/32871; H01J 2237/3341; H01J 2237/335
See application file for complete search history.

(56) References Cited

U.S. PATENT DOCUMENTS

| 7,357,138 B2 * | 4/2008 | Ji | ........................ C23C 16/4405 |
| | | | 134/1.1 |
| 2004/0011380 A1 * | 1/2004 | Ji | ........................ C23C 16/4405 |
| | | | 134/1.1 |
| 2005/0164479 A1 * | 7/2005 | Perng | ................... H10D 64/685 |
| | | | 257/E21.434 |

(Continued)

FOREIGN PATENT DOCUMENTS

| EP | 1382716 A2 * | 1/2004 | ............... B08B 7/00 |
| JP | 2016-201476 A | 12/2016 | |

(Continued)

OTHER PUBLICATIONS

International Search Report for PCT/KR2023/002561 mailed Jun. 7, 2023 from Korean Intellectual Property Office.
(Continued)

*Primary Examiner* — Sharidan Carrillo
(74) *Attorney, Agent, or Firm* — Paratus Law Group, PLLC

(57)          ABSTRACT
A substrate treating method for removing a dielectric by-product produced by etching a dielectric film formed on a substrate, includes: providing a gaseous boron compound into a reaction chamber to remove the dielectric by-product; and purging an inside of the reaction chamber. The boron compound is represented by $B_nX_{3n}$, where X is hydrogen, alkyl, amino, or halogen, and n is a natural number greater than or equal to 1.

16 Claims, 9 Drawing Sheets

(52) U.S. Cl.
CPC .... *H10P 50/285* (2026.01); *H01J 2237/3341* (2013.01); *H01J 2237/335* (2013.01)

(56) References Cited

U.S. PATENT DOCUMENTS

| | | | | |
|---|---|---|---|---|
| 2008/0064220 A1* | 3/2008 | Fernandez | ........ | H01J 37/32697 |
| | | | | 438/719 |
| 2010/0099264 A1 | 4/2010 | Elers | | |
| 2018/0345330 A1* | 12/2018 | Zhai | .......................... | B08B 9/00 |
| 2024/0112888 A1* | 4/2024 | Zhang | ................. | H01J 37/3244 |

FOREIGN PATENT DOCUMENTS

| | | |
|---|---|---|
| JP | 2017-528910 A | 9/2017 |
| JP | 2021-507509 A | 2/2021 |
| KR | 10-2003-0004681 A | 1/2003 |
| KR | 10-2003-0059506 A | 7/2003 |
| KR | 10-2009-0038066 A | 4/2009 |
| KR | 10-2016-0075240 A | 6/2016 |
| KR | 10-2020-0085935 A | 7/2020 |
| WO | WO-2019051364 A1 * | 3/2019 ........... C23C 16/405 |

OTHER PUBLICATIONS

Korean Office Action for related KR Application No. 10-2023-0023892 mailed Mar. 20, 2024 from Korean Intellectual Property Office.

Japanese Office Action for related JP Application No. 2024-550913 mailed Aug. 12, 2025 from Japan Patent Office.

* cited by examiner (a)

(b)

(c)

(a)

(b)

(a)

(b)

(a)

(b)

(a)

(b)

(a)

(b)

(c)

(d)

(e)

METHOD FOR TREATING SUBSTRATE USING BORON COMPOUND

CROSS-REFERENCE TO PRIOR APPLICATIONS

This application is a National Stage Patent Application of PCT International Application No. PCT/KR2023/002561 (filed on Feb. 22, 2023), which claims priority to Korean Patent Application No. 10-2022-0028405 (filed on Mar. 4, 2022), which are all hereby incorporated by reference in their entirety.

BACKGROUND

The present disclosure relates to a substrate treating method for removing a dielectric by-product produced during dielectric patterning.

More specifically, the present disclosure relates to a substrate treating method for removing a by-product produced after dielectric etching using a boron compound such as diborane ($B_2H_6$). A dielectric material such as hafnium oxide, aluminum oxide, titanium oxide, and zirconium oxide is mainly used as an insulating film material such as a gate insulating film and a capacitor insulating film due to a high dielectric constant thereof.

When a dielectric film is patterned in a dry etching or wet etching manner to expose an element under the dielectric film, the element under the dielectric film may not be exposed, and a by-product of the dielectric may remain. For example, as shown in FIG. 1, a hafnium oxide film 10 is deposited to have a thickness of about 3.39 nm, and then hafnium oxide is etched in a dry etching manner so as to be patterned. However, as shown in FIG. 2, an entirety of the hafnium oxide is not removed such that a hafnium oxide by-product 10 having a thickness of about 15.73 nm may remain.

The dielectric by-product may be one in which a component of the dielectric and a component of the etchant are chemically bonded to each other. Among the dielectric by-products, a non-sublimable compound may not be easily removed. The dielectric by-product may act as a factor causing deterioration of electrical properties and/or mechanical properties of a device, and as a result, deterioration of reliability of the device, and thus needs to be removed.

Thus, it has been conceived to further perform dry etching to remove the dielectric by-product. However, the removal efficiency of the dielectric by-product was not high even under the further etching.

SUMMARY

A purpose of the present disclosure is to provide a substrate treating method capable of efficiently removing a dielectric by-product produced when patterning a dielectric film to expose an element under the dielectric film.

According to an embodiment of the present disclosure for achieving the above purpose, a substrate treating method for removing a dielectric by-product produced by etching a dielectric film formed on a substrate includes providing a gaseous boron compound into a reaction chamber to remove the dielectric by-product; and purging an inside of the reaction chamber, wherein the boron compound may be represented by $B_nX_{3n}$, where X may be hydrogen, alkyl, amino, or halogen, and n may be a natural number greater than or equal to 1.

The boron compound may include at least one of $BH_3$, $B_2H_6$, $B(CH_3)_3$, $B(N(CH_3)_2)_3$, $BF_3$ and $BCl_3$.

The dielectric film may include at least one of $Al_2O_3$, $HfO_2$, $TiO_2$, $ZrO_2$, $Y_2O_3$, $La_2O_3$, $UO_2$, $Lu_2O_3$, $Ta_2O_5$, $Nb_2O_5$, ZnO, MgO, CaO, BeO, $V_2O_5$, FeO, $FeO_2$, CrO, $Cr_2O_3$, $CrO_2$, MnO, $Mn_2O_3$, RuO, CoO and $WO_3$.

The boron compound may be converted to plasma in a remote plasma system and the plasma thereof may be supplied into the reaction chamber.

In the removing of the dielectric by-product, an inert gas together with the boron compound may be supplied into the reaction chamber.

A ratio of a flow rate of the boron compound to a flow rate of the inert gas may be in a range of 1:1 to 1:5.

The removing of the dielectric by-product may be performed at a substrate temperature of 200° C. or higher and a pressure of 0.3 Torr to 3 Torr.

The etching of the dielectric film and the removal of the dielectric by-product may be performed in the same chamber.

According to an embodiment of the present disclosure for achieving the above purpose, a substrate treating method for removing a dielectric by-product produced by etching a dielectric film formed on a substrate includes applying RF power to a reaction chamber; providing a gaseous boron compound into the reaction chamber and converting the boron compound into plasma to remove the dielectric by-product; and purging an inside of the reaction chamber, wherein the boron compound may be represented by $B_nX_{3n}$, where X may be hydrogen, alkyl, amino, or halogen, and n may be a natural number greater than or equal to 1.

The boron compound may include at least one of $BH_3$, $B_2H_6$, $B(CH_3)_3$, $B(N(CH_3)_2)_3$, $BF_3$ and $BCl_3$.

The dielectric film may include at least one of $Al_2O_3$, $HfO_2$, $TiO_2$, $ZrO_2$, $Y_2O_3$, $La_2O_3$, $UO_2$, $Lu_2O_3$, $Ta_2O_5$, $Nb_2O_5$, ZnO, MgO, CaO, BeO, $V_2O_5$, FeO, $FeO_2$, CrO, $Cr_2O_3$, $CrO_2$, MnO, $Mn_2O_3$, RuO, CoO and $WO_3$.

In the removing of the dielectric by-product, an inert gas together with the boron compound may be supplied into the reaction chamber.

A ratio of a flow rate of the boron compound to a flow rate of the inert gas may be in a range of 1:1 to 1:5.

The removing of the dielectric by-product may be performed at a substrate temperature of 200° C. or higher and a pressure of 0.3 Torr to 3 Torr.

The RF power may be applied under a condition of 200 to 1000 W.

The etching of the dielectric film and the removal of the dielectric by-product may be performed in the same chamber.

According to the substrate treating method according to the present disclosure, the dielectric by-product produced by etching the dielectric film contacts the boron compound such as $BH_3$, $B_2H_6$, and $BF_3$, such that the dielectric by-product can be effectively removed. This may prevent deterioration of electrical characteristics of the manufactured semiconductor device, thereby improving device reliability.

In particular, the boron compound is converted to the plasma using the RF power, and the plasma removes the dielectric by-product. Thus, the dielectric by-product can be removed at a higher efficiency.

The effects of the present disclosure are not limited to the above-mentioned effects, and other effects not mentioned above may be clearly understood by those skilled in the art from the following detailed descriptions.

DETAILED DESCRIPTION

Advantages and features of the present disclosure, and a method of achieving the advantages and features will become apparent with reference to embodiments described later in detail together with the accompanying drawings. However, the present disclosure is not limited to an embodiment as disclosed under, but may be implemented in various different forms. Thus, these embodiments are set forth only to make the present disclosure complete, and to completely inform the scope of the present disclosure to those of ordinary skill in the technical field to which the present disclosure belongs, and the present disclosure is only defined by the scope of the claims.

In addition, it will also be understood that when a first element or layer is referred to as being present "on" or "under" a second element or layer, the first element may be disposed directly on or under the second element or may be disposed indirectly on or under the second element with a third element or layer being disposed between the first and second elements or layers. When a component is described as being "connected", "coupled", or "combined" to another component, the component may be directly connected or coupled to the another component, or still another component may be "interposed" therebetween or the component may be "connected," "combined," or "connected" thereto via still another component.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof.

Hereinafter, a substrate treating method according to a preferred embodiment of the present disclosure will be described in detail with reference to the accompanying drawings.

Figure 1:
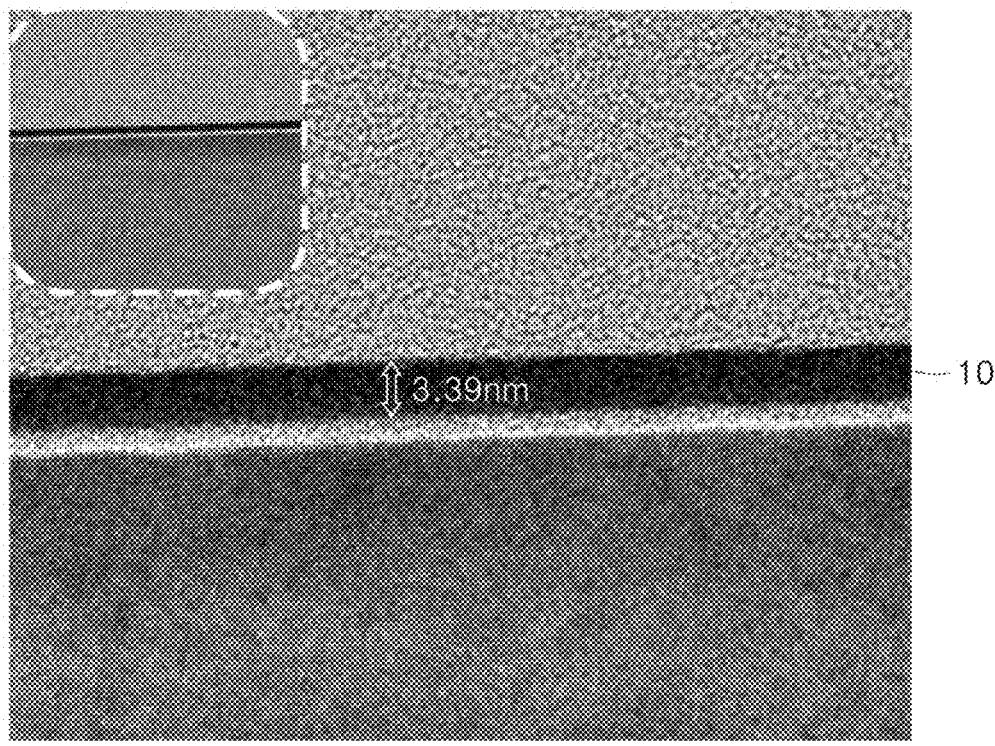
FIG. 1 shows a photograph of deposited hafnium oxide.
Figure 2:
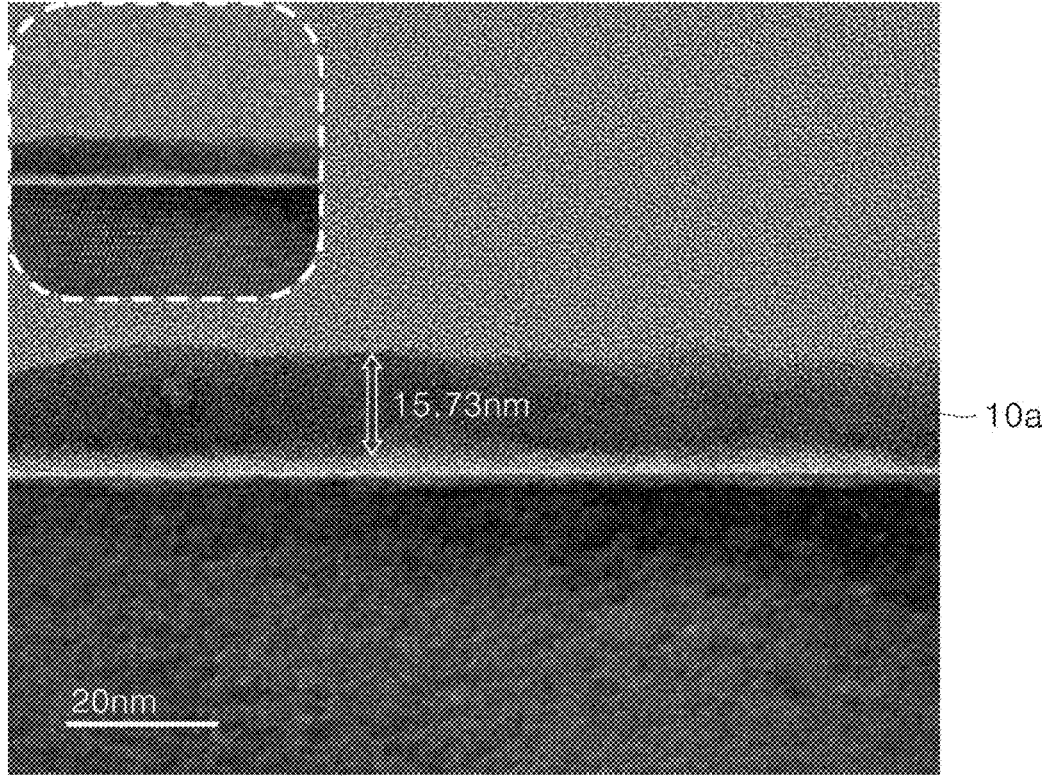
FIG. 2 shows an image in which a by-product remains after hafnium oxide etching.
Figure 3:
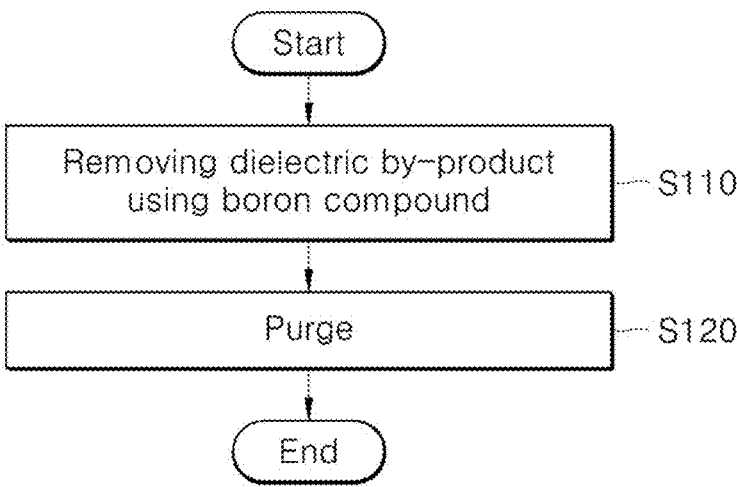
FIG. 3 schematically illustrates a substrate treating method according to an embodiment of the present disclosure.

FIG. 3 schematically illustrates a substrate treating method according to an embodiment of the present disclosure.

Referring to FIG. 3, the substrate treating method according to an embodiment of the present disclosure includes a step S110 of removing a dielectric by-product using a boron compound and a purge step S120.

In the present embodiment, an etching target is a dielectric by-product produced by etching a dielectric film with an etchant on a substrate on which the dielectric film has been formed. The dielectric film may include at least one selected from the group consisting of $Al_2O_3$, $HfO_2$, $TiO_2$, $ZrO_2$, $Y_2O_3$, $La_2O_3$, $UO_2$, $Lu_2O_3$, $Ta_2O_5$, $Nb_2O_5$, $ZnO$, $MgO$, $CaO$, $BeO$, $V_2O_5$, $FeO$, $FeO_2$, $CrO$, $Cr_2O_3$, $CrO_2$, $MnO$, $Mn_2O_3$, $RuO$, $CoO$ and $WO_3$. The etching of the dielectric film may be performed using, for example, a dry etching scheme using $HF$ and $NF_3$ as a reaction gas and $Ar$ as a carrier gas. In this case, the etching of the dielectric film and the removal reaction of the dielectric by-product may be performed in the same reaction chamber. In another example, the etching of the dielectric film may be performed in a wet etching scheme.

The dielectric by-product may be produced via a chemical reaction between some components of the dielectric film and some components of the etchant.

In the step S110 of removing the dielectric by-product using the boron compound, the boron compound in a gas phase is provided into the reaction chamber to remove the dielectric by-product. This may be performed for about 5 to 15 minutes.

In this case, the boron compound used in the present disclosure is represented by $B_nX_{3n}$ (where X is hydrogen, alkyl, amino, or halogen, and n is a natural number greater than or equal to 1). In this regard, n may be, but is not limited to, 1 or 2.

The boron compound used in the present disclosure is a compound in which three hydrogen atoms are bonded to one boron and which is represented by the chemical formula $B_nX_{3n}$. A representative example of the boron compound is diborane represented by $B_2H_6$. However, the example is limited thereto, and various boron compounds as set forth below may be used in the substrate treating method according to the present disclosure. More specifically, the boron compound that may be easily considered in the present disclosure may be $BH_3$, $B_2H_6$, $B(CH_3)_3$, $B(N(CH_3)_2)_3$, $BF_3$, $BCl_3$, etc. which may be used alone or in combination of two or more thereof.

In the present embodiment, the dielectric by-product is removed using the boron compound in the gas phase. The boron compound that may be used in the present embodiment is in a gaseous state or a liquid state at room temperature. When the boron compound is in a gaseous state at room temperature, the boron compound may be directly supplied into the reaction chamber. In another example, when the boron compound is in a liquid state at room temperature, the boron compound may be brought into a vaporized state through a vaporizer and then may be supplied into the reaction chamber.

In the step S110 of removing the dielectric by-product, an inert gas such as helium or argon together with the boron compound may be provided into the reaction chamber. Such inert gas may function as a carrier gas of the boron compound.

Especially, when both the boron compound and the inert gas are provided into the reaction chamber, higher dielectric by-product removal efficiency is obtained than that when only the boron compound without the inert gas is provided into the reaction chamber, That is, the inert gas may contribute to improving reaction efficiency between the boron compound and the dielectric by-product.

A flow rate ratio of the boron compound to the inert gas may be in a range of 1:1 to 1:5. For example, when the flow rate of the boron compound is 100 sccm, the flow rate of the inert gas may be in a range of 100 to 500 sccm. The highest dielectric by-product effect may be achieved in the flow rate ratio range of the boron compound to the inert gas as defined above.

The dielectric by-product removal reaction may be performed at a substrate temperature of about $200°$ C. or higher, for example, in a range of $200°$ C. to $800°$ C. A suitable substrate temperature may vary depending on a type of each of the dielectric material and the boron compound. For example, when the dielectric material is hafnium oxide and the boron compound is diborane, the dielectric by-product removal reaction may be performed at a substrate temperature of about $500°$ C. When the substrate temperature is too low, the dielectric by-product removal reaction may not be smoothly performed, thus, in terms of reaction efficiency, it is preferable that the dielectric by-product removal reaction is performed at a high temperature of about $200°$ C. or higher.

In addition, the dielectric by-product removal reaction may be performed at a pressure of 0.3 to 3 torr, more preferably 0.1 to 1 torr. When an internal pressure of the reaction chamber is within the above defined range, the dielectric by-product removal reaction may be smoothly performed.

In one example, the boron compound may be brought into a plasma state in a remote plasma system outside the reaction chamber and then be supplied into the reaction chamber. In this case, the efficiency of the dielectric by-product removal reaction may be improved, or the substrate temperature required for the dielectric by-product removal reaction may be lowered.

The dielectric material may remain in the dielectric by-product as it is. In this case, the boron compound may react with the dielectric material. For example, when the dielectric material is hafnium oxide, and the boron compound is diborane, hafnium oxide may be removed in a following reaction. The resulting $HF(BH_4)_4$ may be sublimated and $H_2O$ may be vaporized.

$$2B_2H_6 + HfO_2 + 4H_2 \rightarrow HF(BH_4)_4 + 2H_2O$$

In the purge step S120, an inside of the reaction chamber is purged using a purge gas. An inert gas such as argon or a nitrogen gas may be used as the purge gas.

After the purge step, a step such as annealing may be performed as necessary.

According to the present embodiment, the dielectric by-product produced when the dielectric film is etched contacts the boron compound such as $BH_3$, $B_2H_6$, and $BF_3$. Thus, the dielectric by-product may be effectively removed via a chemical reaction between the dielectric by-product and the boron compound.

Figure 4:
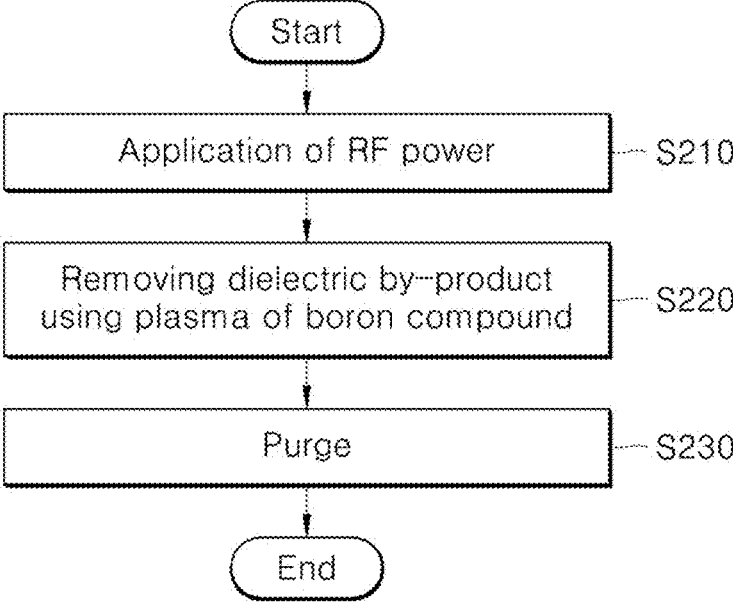
FIG. 4 schematically illustrates a substrate treating method according to another embodiment of the present disclosure.

FIG. 4 schematically illustrates a substrate treating method according to another embodiment of the present disclosure.

Referring to FIG. 4, the substrate treating method according to the present embodiment includes an RF power applying step S210, a step of removing a dielectric by-product using plasma of the boron compound in S220, and a purge step S230.

Like an embodiment as shown in FIG. 3, in the present embodiment, the substrate to be treated is a substrate on which the dielectric by-product is produced by etching the dielectric film formed on the substrate.

The dielectric film may at least one of $Al_2O_3$, $HfO_2$, $TiO_2$, $ZrO_2$, $Y_2O_3$, $La_2O_3$, $UO_2$, $Lu_2O_3$, $Ta_2O_5$, $Nb_2O_5$, $ZnO$, $MgO$, $CaO$, $BeO$, $V_2O_5$, $FeO$, $FeO_2$, $CrO$, $Cr_2O_3$, $CrO_2$, $MnO$, $Mn_2O_3$, $RuO$, $CoO$ and $WO_3$.

In one example, in the present embodiment, RF power is applied to the reaction chamber.

Figure 5:
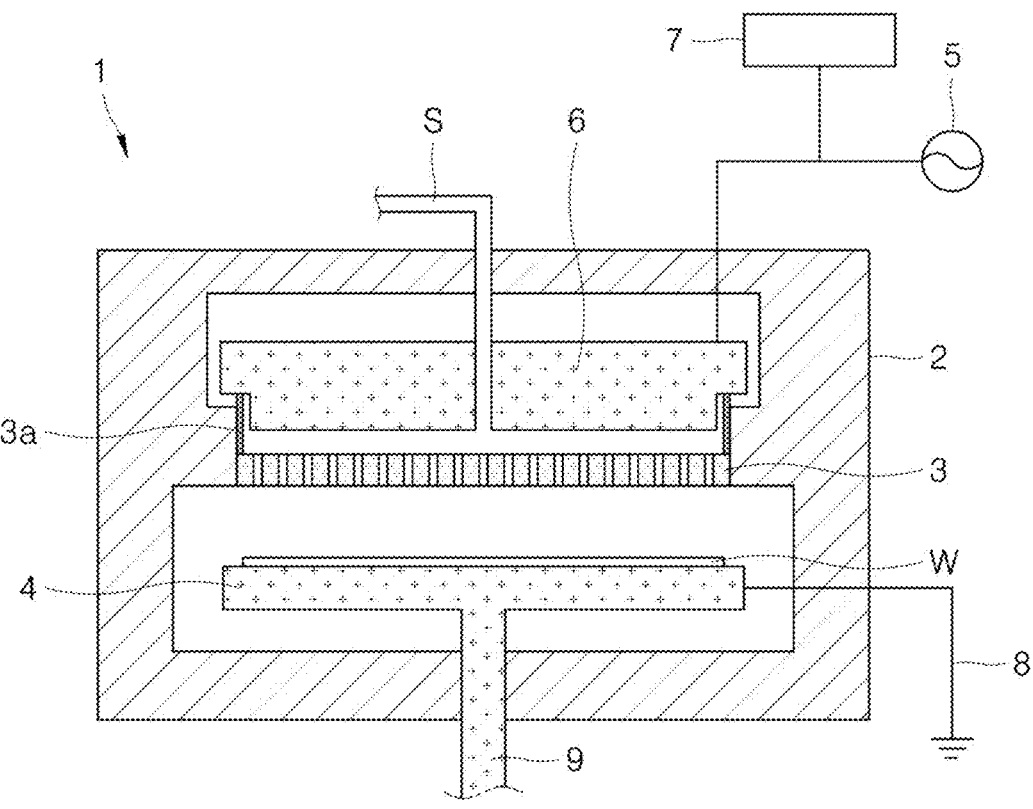
FIG. 5 schematically illustrates an example of a substrate treating apparatus that may be used in the substrate treating method of FIG. 4.

FIG. 5 schematically illustrates an example of a substrate treating apparatus that may be used in the substrate treating method of FIG. 4.

Referring to FIG. 5, the substrate treating apparatus includes a reaction chamber 2, a showerhead 3, a susceptor 4, an RF power source 5, and a first electrode 6.

The showerhead 3 is provided at an upper portion of an inner space of the reaction chamber 2 and is configured to receive gas through a plurality of gas supply lines S connected to an external gas supply device (not shown) and to inject the gas into the reaction chamber.

In the present embodiment, the gas supply lines S may include a boron compound supply line and an inert gas supply line. The boron compound and the inert gas may be supplied into the reaction chamber in a mixed state. In another example, the boron compound and the inert gas may be separately supplied into the reaction chamber.

The first electrode 6 is electrically connected to the RF power source 5 and is used as an electrode for plasma discharge in the reaction chamber 2. In the example shown in FIG. 5, the showerhead 3 is electrically connected 3a to the first electrode 6 so that the first electrode 6 and the showerhead 3 together function as a single electrode. Accordingly, the RF power generated from the RF power source 5 is applied to the inside of the reaction chamber 2 through the first electrode 6 and the showerhead 3. A RF filter 7 removes signal interference generated around the reaction chamber 2.

The susceptor 4 on which the substrate W is loaded (supported) is provided at a lower portion of the inner space of the reaction chamber 2. The susceptor 4 may be provided with a temperature control means for heating/cooling the substrate. In addition, as shown in FIG. 5, the susceptor 4 may function as a ground electrode. In order to further improve the grounding performance, a separate ground line 8 may be provided. Although not shown, a high frequency power source or a DC power source may be connected to the susceptor 4 itself such that the susceptor 4 may act as a second electrode (a bias electrode).

Referring back to FIG. 4, the substrate treating method according to the present embodiment first applies the RF power to the reaction chamber in S210.

The RF power may be applied in an RF frequency condition such as 13.56 MHz. In addition, the RF power may be applied in a condition of 200 to 1000 W, more preferably 400 to 600 W. The dielectric by-product removal reaction may be performed stably when RF power is in the above-defined range. However, when the RF power is out of the above-defined range, film deformation and/or film damage may be caused.

Next, in the step of removing the dielectric by-product in S220, the boron compound in the gas phase may be supplied into the reaction chamber, and the boron compound may be converted to plasma to remove the dielectric by-product. This may be performed for about 5 to 15 minutes.

The boron compound used in the present embodiment is represented by $B_nX_{3n}$ (where X is hydrogen, alkyl, amino, or halogen, and n is a natural number greater than or equal to 1). In this regard, n may be, but is not limited to, 1 or 2. In one example, the boron compound available in this example may include at least one, for example, $BH_3$, $B_2H_6$, $B(CH_3)_3$, $B(N(CH_3)_2)_3$, $BF_3$ and $BCl_3$.

In a similar manner to an embodiment shown in FIG. 3, in the step of removing the dielectric by-product in S220, the inert gas such as argon together with the boron compound may be provided into the reaction chamber. The flow rate ratio of the boron compound to the inert gas may be in a range of about 1:1 to about 1:5.

The boron compound and/or the inert gas may be provided to the inside of the reaction chamber either before or after the RF power application or at the same time as that of the application of RF power.

Further, like the embodiment shown in FIG. 3, the step of removing the dielectric by-product may be performed at a substrate temperature of 200° C. or higher and a pressure of 0.3 Torr to 3 Torr.

In the purge step S230, the inside of the reaction chamber is purged using an inert gas, a nitrogen gas, or the like.

After the purge step S230, the annealing process may be performed as necessary.

According to the substrate treating method according to the present embodiment, boron compounds such as $BH_3$, $B_2H_6$, and $BF_3$ may be converted to plasma which may react with the dielectric by-product, thereby further increasing the removal efficiency of the dielectric by-product.

EXAMPLE

Hereinafter, the composition and effect of the present disclosure will be described in more detail through a preferred example of the present disclosure. However, this is presented as a preferred example of the present disclosure and may not be interpreted as limiting the present disclosure in any way.

The contents not described herein may be sufficiently technically inferred by those skilled in this technical field, and thus a description thereof will be omitted.

Figure 6:
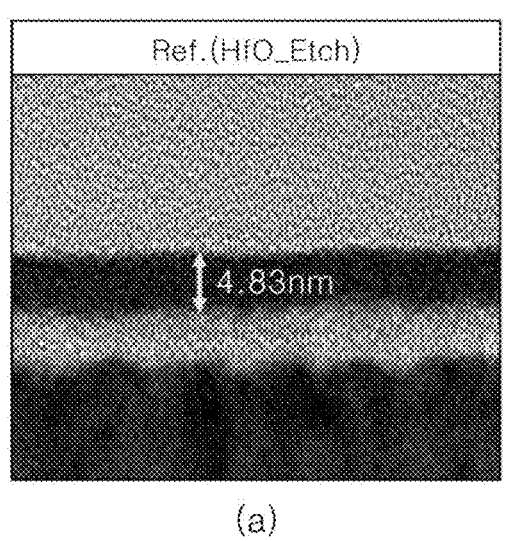
FIG. 6 shows (a) a TEM photograph of a sample obtained by etching hafnium oxide, (b) a TEM photograph of a sample from which a by-product of hafnium oxide has been removed using diborane according to Example 1, and (c) a TEM photograph of a sample from which a by-product of hafnium oxide has been removed using diborane according to Example 2.
Figure 6:
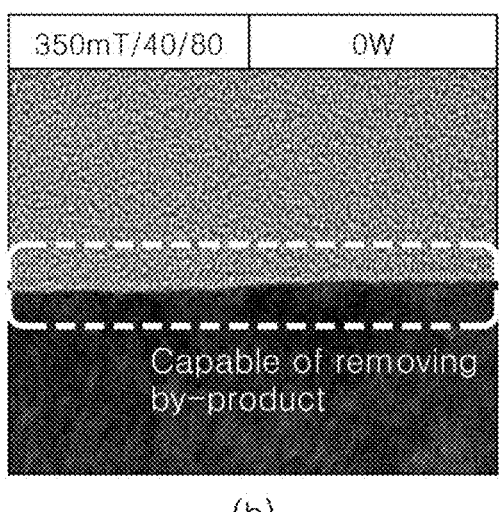
Figure 6:
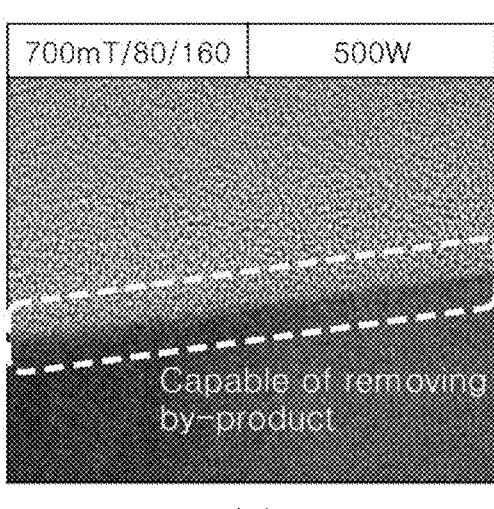

FIG. 6 shows (a) a TEM photograph of a sample obtained by etching hafnium oxide, (b) a TEM photograph of a sample from which a by-product of hafnium oxide has been removed using diborane according to Example 1, and (c) a TEM photograph of a sample from which a by-product of hafnium oxide has been removed using diborane according to Example 2.

The hafnium oxide was deposited on the substrate used in each of Examples 1 and 2, and then the hafnium oxide was patterned in a dry etching scheme using HF and $NF_3$ as a reaction gas and Ar as a carrier gas. At this time, a by-product of a thickness of 4.83 nm was produced as shown in (a) in FIG. 6.

In Example 1, a hafnium oxide by-product removal reaction was performed at a substrate temperature of 500° C., a chamber pressure of 350 mtorr, a diborane flow rate of 40 sccm, and an argon flow rate of 80 sccm for 10 minutes. In Example 1, RF power was not applied.

In Example 2, a hafnium oxide by-product removal reaction was performed at a substrate temperature of 500° C., a chamber pressure of 700 Mtorr, a diborane flow rate of 80 sccm, and an argon flow rate of 160 sccm for 10 minutes. In Example 2, RF power was applied under a condition of 13.56 MHz and 500 W.

Referring to (b) and (c) in FIG. 6, in Examples 1 and 2, the hafnium oxide by-product was almost entirely removed. In addition, as a result of visually checking the substrates of Examples 1 and 2, it was identified that surface discoloration of the wafer was not present when the hafnium oxide by-product removal process was performed using diborane.

From the result of FIG. 6, it may be identified that the boron compound such as diborane is effective in the removal of the hafnium oxide by-product.

Figure 7:
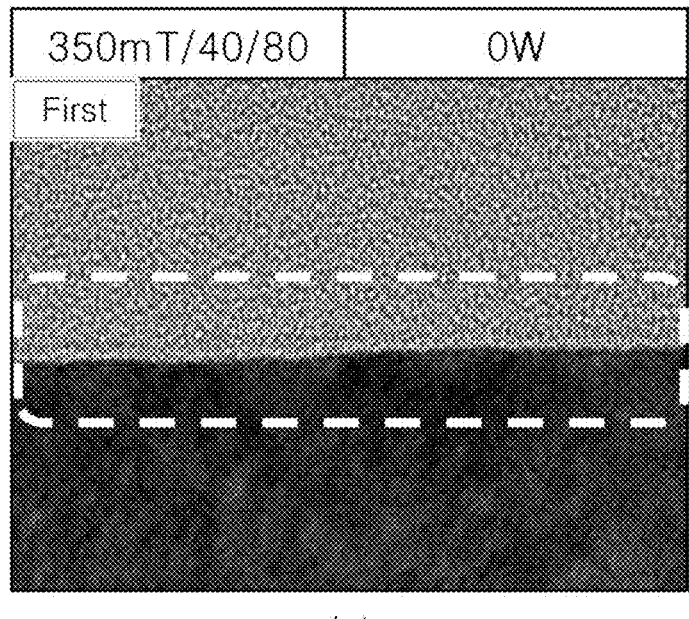
FIG. 7 shows a result of performing (a) a first test and (b) a second test under a process condition of Example 1.
Figure 8:
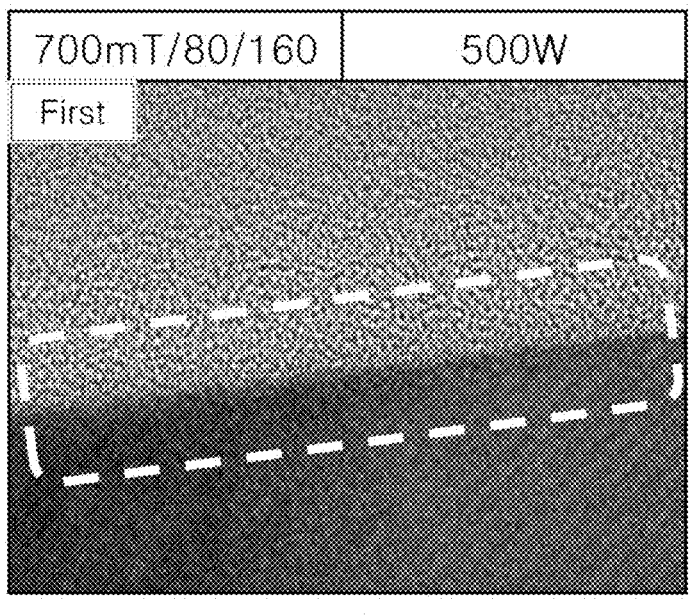
FIG. 8 shows a result of performing (a) a first test and (b) a second test under a process condition of Example 2.

FIG. 7 shows a result of performing (a) a first test and (b) a second test under a process condition of Example 1. FIG. 8 shows a result of performing (a) a first test and (b) a second test under a process condition of Example 2.

Referring to FIGS. 7 and 8, the hafnium oxide by-product removal effect of FIG. 8 is relatively higher than that of FIG. 7. Accordingly, it may be identified that the hafnium oxide by-product removal effect may be obtained more clearly when the hafnium oxide by-product removal process is performed using diborane under RF power.

Figure 9:
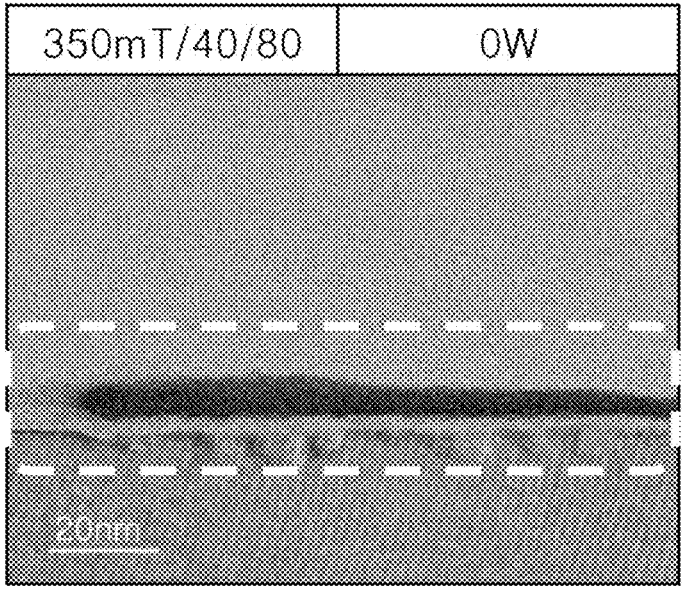
FIG. 9 shows a test result under (a) a process condition of Example 1 and (b) a process condition of Example 3.
Figure 9:
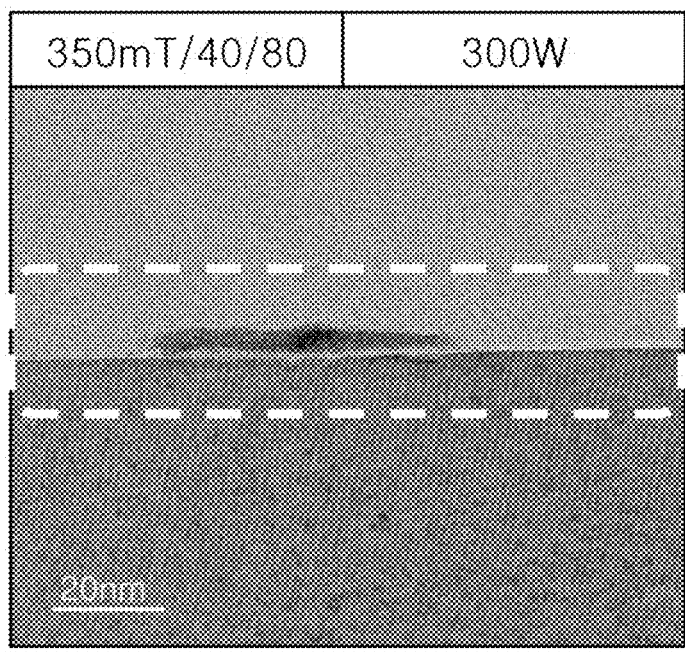

FIG. 9 shows a test result under (a) a process condition of Example 1 and (b) a process condition of Example 3.

In FIG. 9, (a) shows a second test result under a process condition of Example 1 and (b) shows a second test result under a process condition of Example 3.

A hafnium oxide by-product removal reaction in Example 3 was performed under the same condition as that of Example 1, except that RF power of 300 W was applied.

Referring to FIG. 9, the hafnium oxide by-product removal effect may vary depending on the RF power value under the same process pressure and gas flow rate. In particular, a higher by-product removal effect may be obtained when the process is performed under the RF power. However, when the process is performed under 300 W RF power, the by-product partially remains as compared to Example 2 in which the process is performed under 500 W RF power.

Figure 10:
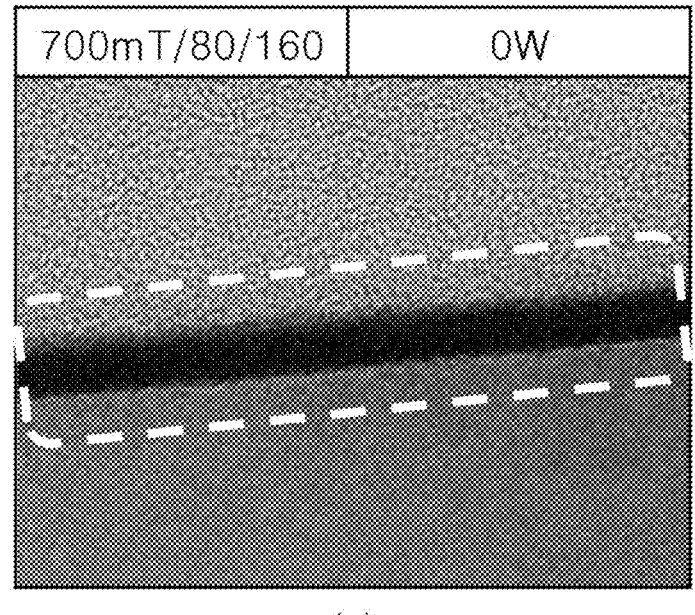
FIG. 10 shows a test result under (a) a process condition of Example 4 and (b) a process condition of Example 5.
Figure 10:
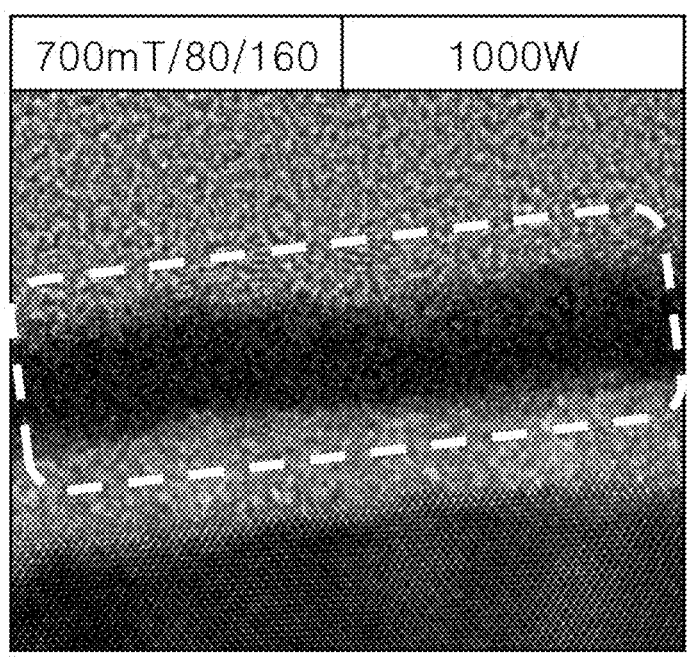

FIG. 10 shows a test result under (a) a process condition of Example 4 and (b) a process condition of Example 5.

A hafnium oxide by-product removal reaction in Example 4 was performed under the same condition as that of Example 2, except that RF power was not applied in Example 4.

A hafnium oxide by-product removal reaction in Example 5 was performed under the same condition as that of Example 2, except that RF power of 1000 W was applied in Example 5.

Referring to FIG. 10, it may be identified that the hafnium oxide by-product removal effect may vary depending on the RF power value under the same process pressure and gas flow rate condition. However, when a process is performed under each of 0 and 1000 W RF powers, the by-product partially remains compared to Example 2 in which the process is performed under 500 W RF power.

Figure 11:
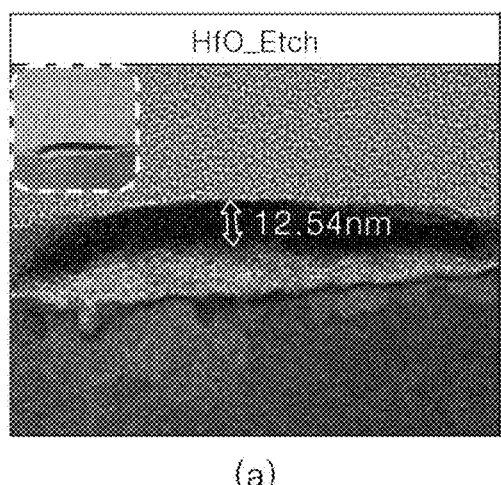
FIG. 11 is (a) TEM photograph of a sample obtained by etching hafnium oxide, (b) a TEM photograph of a sample from which a by-product of hafnium oxide has been removed using diborane according to Example 6, (c) a TEM photograph of a sample obtained by removing a by-product of hafnium oxide using a diborane according to Example 7, (d) a TEM image of a sample from which a by-product of hafnium oxide has been removed using diborane according to Example 8, and (e) a TEM photograph of a sample from which a by-product of hafnium oxide has been removed using diborane according to Example 9.
Figure 11:
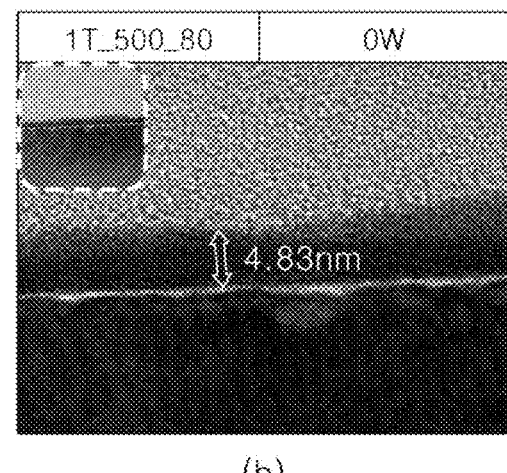
Figure 11:
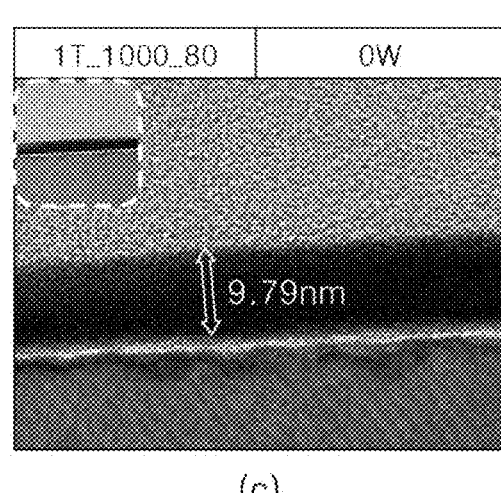
Figure 11:
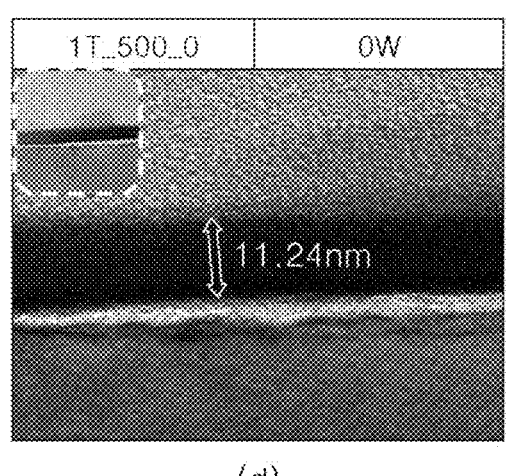
Figure 11:
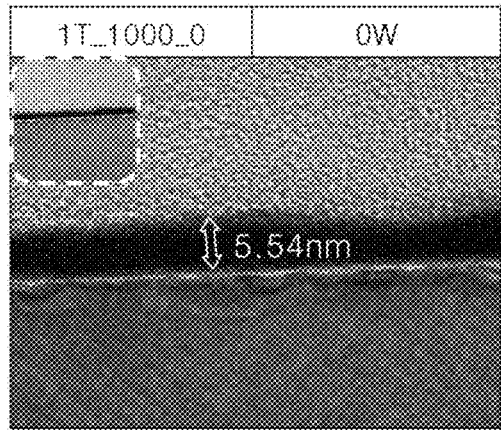

FIG. 11 shows a test result based on change in a flow rate of each of diborane and argon gas.

Specifically, FIG. 11 is (a) TEM photograph of a sample obtained by etching hafnium oxide, (b) a TEM photograph of a sample from which a by-product of hafnium oxide has been removed using diborane according to Example 6, (c) a TEM photograph of a sample obtained by removing a by-product of hafnium oxide using a diborane according to Example 7, (d) a TEM image of a sample from which a by-product of hafnium oxide has been removed using diborane according to Example 8, and (e) a TEM photograph of a sample from which a by-product of hafnium oxide has been removed using diborane according to Example 9.

The hafnium oxide was deposited on the substrate used in each of Examples 6 to 9, and then the hafnium oxide was patterned in a dry etching scheme using HF and $NF_3$ as a reaction gas and Ar as a carrier gas. At this time, a by-product of a thickness of 12.54 nm was produced as shown in (a) in FIG. 11.

In Example 6, a hafnium oxide by-product removal reaction was performed at a substrate temperature of 500° C., a chamber pressure of 1 Torr, a diborane flow rate of 500 sccm, and an argon flow rate of 80 sccm for 10 minutes. In Example 6, RF power was not applied.

A hafnium oxide by-product removal reaction in Example 7 was performed under the same condition as that of Example 6, except that the flow rate of the diborane was 1000 sccm in Example 7.

A hafnium oxide by-product removal reaction in Example 8 was performed under the same condition as that of Example 6, except that the argon flow rate was 0 sccm, that is, only diborane was supplied into the reaction chamber without argon gas in Example 8.

A hafnium oxide by-product removal reaction in Example 9 was performed under the same condition as that of Example 6, except that the flow rate of the diborane was 1000 sccm and the flow rate of argon was 0 sccm in Example 9.

Referring to (b) to (e) of FIG. 11, it may be identified that when only the gas amount of the diborane is increased or only the diborane gas is used without the argon gas, without applying the RF power (that is, OW), the by-product remains to some extent. It may be identified that when both diborane and the inert gas such as argon are used together under the application of RF power, the most efficient dielectric by-product removal is achieved.

In addition, a further test was performed in which the dielectric material on the substrate was changed to each of $Al_2O_3$, $TiO_2$, $ZrO_2$, $Y_2O_3$, $La_2O_3$, $UO_2$, $Lu_2O_3$, $Ta_2O_5$, $Nb_2O_5$, ZnO, MgO, CaO, BeO, $V_2O_5$, FeO, $FeO_2$, CrO, $Cr_2O_3$, $CrO_2$, MnO, $Mn_2O_3$, RuO, CoO or $WO_3$ and the boron compound was changed to each of $BH_3$, $B(CH_3)_3$, $B(N(CH_3)_2)_3$, $BF_3$ or $BCl_3$. In this case, the test result similar to that of FIGS. 6 to 11 was achieved.

Although embodiments of the present disclosure have been described above, various changes or modifications may be made at the level of those skilled in the art. Such modifications and variations may be made to the present disclosure as long as they do not depart from the scope of the present disclosure. Therefore, the scope of the present disclosure should be determined by the claims set forth below.

The invention claimed is:

1. A substrate treating method for removing a dielectric by-product produced by etching a dielectric film formed on a substrate, the method comprising:
   providing a gaseous boron compound into a reaction chamber to remove the dielectric by-product; and
   purging an inside of the reaction chamber, wherein the gaseous boron compound comprises $B_2H_6$.

2. The substrate treating method of claim 1, wherein the only gaseous boron compound present consists of $B_2H_6$.

3. The substrate treating method of claim 1, wherein the dielectric film includes at least one of $Al_2O_3$, $HfO_2$, $TiO_2$, $ZrO_2$, $Y_2O_3$, $La_2O_3$, $UO_2$, $Lu_2O_3$, $Ta_2O_5$, $Nb_2O_5$, ZnO, MgO, CaO, BeO, $V_2O_5$, FeO, $FeO_2$, CrO, $Cr_2O_3$, $CrO_2$, MnO, $Mn_2O_3$, RuO, CoO and $WO_3$.

4. The substrate treating method of claim 1, wherein the gaseous boron compound is converted to plasma in a remote plasma system and the plasma thereof is supplied into reaction chamber.

5. The substrate treating method of claim 1, wherein in the removing of the dielectric by-product, an inert gas is supplied into the reaction chamber.

6. The substrate treating method of claim 1, wherein the removing of the dielectric by-product is performed at a substrate temperature of 200° C. or higher and a pressure of 0.3 Torr to 3 Torr.

7. The substrate treating method of claim 1, wherein the etching of the dielectric film and the removal of the dielectric by-product are performed in the same chamber.

8. The substrate treating method of claim 5, wherein a ratio of a flow rate of the gaseous boron compound to a flow rate of the inert gas is in a range of 1:1 to 1:5.

9. A substrate treating method for removing a dielectric by-product produced by etching a dielectric film formed on a substrate, the method comprising:
   applying RF power to a reaction chamber;
   providing a gaseous boron compound into the reaction chamber and converting the gaseous boron compound into plasma to remove the dielectric by-product; and
   purging an inside of the reaction chamber,
   wherein the gaseous boron compound comprises $B_2H_6$.

10. The substrate treating method of claim 9, wherein the only gaseous boron compound present consists of $B_2H_6$.

11. The substrate treating method of claim 9, wherein the dielectric film includes at least one of $Al_2O_3$, $HfO_2$, $TiO_2$, $ZrO_2$, $Y_2O_3$, $La_2O_3$, $UO_2$, $Lu_2O_3$, $Ta_2O_5$, $Nb_2O_5$, ZnO, MgO, CaO, BeO, $V_2O_5$, FeO, $FeO_2$, CrO, $Cr_2O_3$, $CrO_2$, MnO, $Mn_2O_3$, RuO, CoO and $WO_3$.

12. The substrate treating method of claim 9, wherein in the removing of the dielectric by-product, an inert gas together with the gaseous boron compound is supplied into the reaction chamber.

13. The substrate treating method of claim 9, wherein the removing of the dielectric by-product is performed at a substrate temperature of 200° C. or higher and a pressure of 0.3 Torr to 3 Torr.

14. The substrate treating method of claim 9, wherein the RF power is applied under a condition of 200 to 1000 W.

15. The substrate treating method of claim 9, wherein the etching of the dielectric film and the removal of the dielectric by-product are performed in the same chamber.

16. The substrate treating method of claim 12, wherein a ratio of a flow rate of the gaseous boron compound to a flow rate of the inert gas is in a range of 1:1 to 1:5.

* * * * *